(12) United States Patent
Nakano

(10) Patent No.: US 10,418,255 B2
(45) Date of Patent: Sep. 17, 2019

(54) SEMICONDUCTOR DEVICE PACKAGES AND RELATED METHODS

(71) Applicant: Micron Technology, Inc., Boise, ID (US)

(72) Inventor: Eiichi Nakano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/828,819

(22) Filed: Dec. 1, 2017

(65) Prior Publication Data

US 2019/0172724 A1    Jun. 6, 2019

(51) Int. Cl.
| | | |
|---|---|---|
| *H01L 21/66* | (2006.01) | |
| *H01L 21/447* | (2006.01) | |
| *H01L 21/687* | (2006.01) | |

(52) U.S. Cl.
CPC ...... *H01L 21/447* (2013.01); *H01L 21/68778* (2013.01); *H01L 21/68785* (2013.01); *H01L 2225/06589* (2013.01); *H01L 2225/1094* (2013.01)

(58) Field of Classification Search
CPC ............ H01L 21/447; H01L 21/68778; H01L 21/68785; H01L 2225/06589; H01L 2225/1094
USPC .......................................................... 438/15
See application file for complete search history.

(56) References Cited

U.S. PATENT DOCUMENTS

| | | | | |
|---|---|---|---|---|
| 8,461,690 | B2* | 6/2013 | Yoshida ................ | H01L 21/561 257/686 |
| 8,653,676 | B2* | 2/2014 | Kim ........................ | H01L 24/19 257/790 |
| 8,759,147 | B2* | 6/2014 | Choi ...................... | H01L 21/561 257/678 |
| 8,765,497 | B2* | 7/2014 | Liu ......................... | H01L 23/48 257/686 |
| 8,828,798 | B2* | 9/2014 | England ................ | H01L 21/561 438/107 |
| 9,184,112 | B1* | 11/2015 | Gambino ................ | H01L 23/58 |
| 10,026,724 | B2* | 7/2018 | Kim ..................... | H01L 23/3185 |

FOREIGN PATENT DOCUMENTS

| | | |
|---|---|---|
| KR | 101734382 B1 | 5/2017 |
| WO | 2013127035 A1 | 9/2013 |

\* cited by examiner

*Primary Examiner* — Vu A Vu
(74) *Attorney, Agent, or Firm* — TraskBritt

(57) ABSTRACT

Semiconductor device packages may include a support structure having electrical connections therein. Semiconductor device modules may be located on a surface of the support structure. A molding material may at least partially surround each semiconductor module on the surface of the support structure. A thermal management device may be operatively connected to the semiconductor device modules on a side of the semiconductor device modules opposite the support structure. At least some of the semiconductor device modules may include a stack of semiconductor dice, at least two semiconductor dice in the stack being secured to one another by diffusion of electrically conductive material of electrically conductive elements into one another.

11 Claims, 9 Drawing Sheets

SEMICONDUCTOR DEVICE PACKAGES AND RELATED METHODS

FIELD

This disclosure relates generally to semiconductor device packages and methods of making semiconductor device packages. More specifically, disclosed embodiments relate to methods of making semiconductor device packages that may reduce package height and increase bandwidth for electrical connections, and to such semiconductor device packages.

BACKGROUND

It is a general trend in the electronics industry to decrease the size of components while increasing the bandwidth of those components. For example, chip-on-wafer techniques may generally eliminate relatively tall or thick electrically conductive elements, such as solder bumps, between the bond pads of individual semiconductor dice and a semiconductor wafer in favor of smaller electrically conductive elements such as copper pillars and terminal pads, facilitated by thermo-compression bonding. Additional techniques have sought to decrease the expenditure of resources dedicated to producing packages that, ultimately, are inoperative. For example, fan-out-packaging techniques may provide an increased number of pinouts for signal and power in conjunction with the use of qualified semiconductor dice, using only those semiconductor dice (commonly referred to as "known good dice") confirmed to be operative onto a substrate, and forming a reconstituted wafer around the known-good dice. However, such conventional techniques are expensive and require additional equipment and processing acts.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular semiconductor device package or component thereof or any particular arrangement of components of an intermediate product in a process of making a semiconductor device package, but are merely idealized representations employed to describe illustrative embodiments. Thus, the drawings are not necessarily to scale.

Disclosed embodiments relate generally to methods of making semiconductor device packages that may reduce package height and increase bandwidth for electrical connections. More specifically, disclosed are embodiments of methods of making semiconductor device packages that may employ a modified chip-on-wafer technique when forming a stack of semiconductor dice combined with a modified version of fan-out-packaging when assembling the stacks with other electrical components to produce semiconductor device packages.

As used in this specification, the terms "substantially" and "about" in reference to a given parameter, property, or condition means and includes to a degree that one skilled in the art would understand that the given parameter, property, or condition is met with a small degree of variance, such as within acceptable manufacturing tolerances. For example, a parameter that is substantially or about a specified value or condition may be at least about 90% the specified value or condition, at least about 95% the specified value or condition, or even at least about 99% the specified value or condition.

Figure 1:
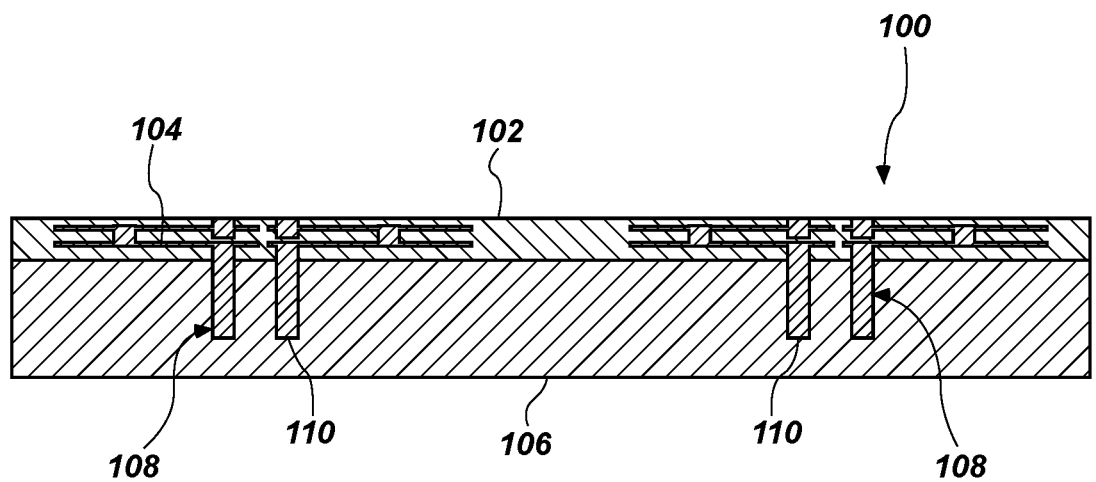
FIG. 1 is a schematic cross-sectional side view of a portion of a semiconductor wafer in a first stage of a method of making semiconductor device packages.

FIG. 1 shows a cross-sectional side view of a portion of a first semiconductor wafer 100 in a first stage of an embodiment of a method of making semiconductor device packages according to the present disclosure. The first semiconductor wafer 100 may include an active surface 102 bearing distinct, laterally spaced regions of integrated circuitry 104 and an inactive surface 106 lacking such integrated circuitry located on a side of the first semiconductor wafer 100 opposite the active surface 102. The first semiconductor wafer 100 may include a semiconductor material, such as, for example, silicon. The integrated circuitry 104 therein may be configured to perform desired operations, such as, for example, acting as computer memory (e.g., flash memory, PROM, EPROM, EEPROM, DRAM, SRAM).

Blind holes 108 may extend from the active surface 102 toward the inactive surface 106. The blind holes 108 may include an electrically conductive material 110 located within the blind holes 108. The electrically conductive material 110 may include a metal or metal alloy, such as, for example, copper, silver, gold, aluminum, or alloys thereof. The electrically conductive material 110 may provide operative, electrical connection to the integrated circuitry 104 of the active surface 102. The electrically conductive material 110 may be positioned in the blind holes 108 by, for example, sputtering or electroplating. The blind holes 108 may be located, for example, in sets located proximate centers, and distal from lateral peripheries, of distinct regions of integrated circuitry 104 configured to form individual semiconductor dice. In other words, the blind holes 108 may be located and mutually arranged to define two rows adjacent to a centerline of what will become discrete semiconductor dice 122 as described below. Of course, the locations of blind holes 108 is not so limited, and any suitable arrangement, including a matrix of columns and rows of blind holes 108, or one or more rows of blind holes 108 adjacent an intended die periphery, may be effected, depending on the functionality of the die circuitry. The blind holes 108 may be formed by, for example, anisotropic etching or laser drilling. In other embodiments, the holes may not be blind holes 108, but may extend entirely through a thickness of the first semiconductor wafer 100, such that the electrically conductive material 110 may be exposed at the active surface 102 and the inactive surface 106.

Figure 2:
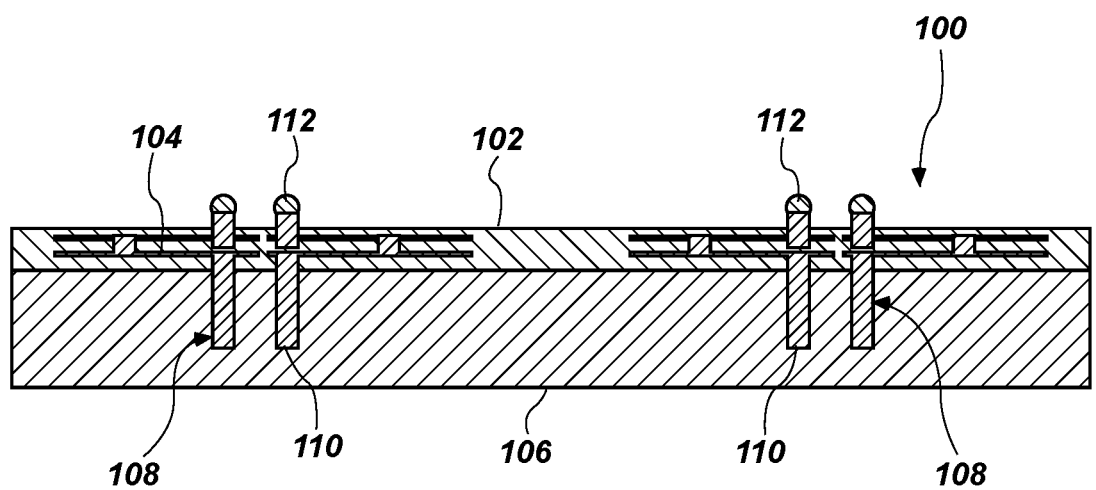
FIG. 2 is a schematic cross-sectional side view of the portion of the semiconductor wafer of FIG. 1 including conductive elements in a second stage of the method of making semiconductor device packages.

FIG. 2 is a cross-sectional side view of the portion of the first semiconductor wafer 100 of FIG. 1 including a first set of electrically conductive elements 112 in a second stage of the method of making semiconductor device packages. The first set of electrically conductive elements 112 may be located on exposed ends of the electrically conductive material 110, such that the first set of electrically conductive elements 112 may be operatively and electrically connected to the integrated circuitry 104 of the active surface 102. The first set of electrically conductive elements 112 may include, for example, pillars, studs, balls, bumps, or pads of electrically conductive material (e.g., metal or metal alloys). The first set of electrically conductive elements 112 may be positioned on the electrically conductive material 110 in the blind holes 108 utilizing, for example, ball grid array formation, electroplating, or electroless plating techniques.

Figure 3:
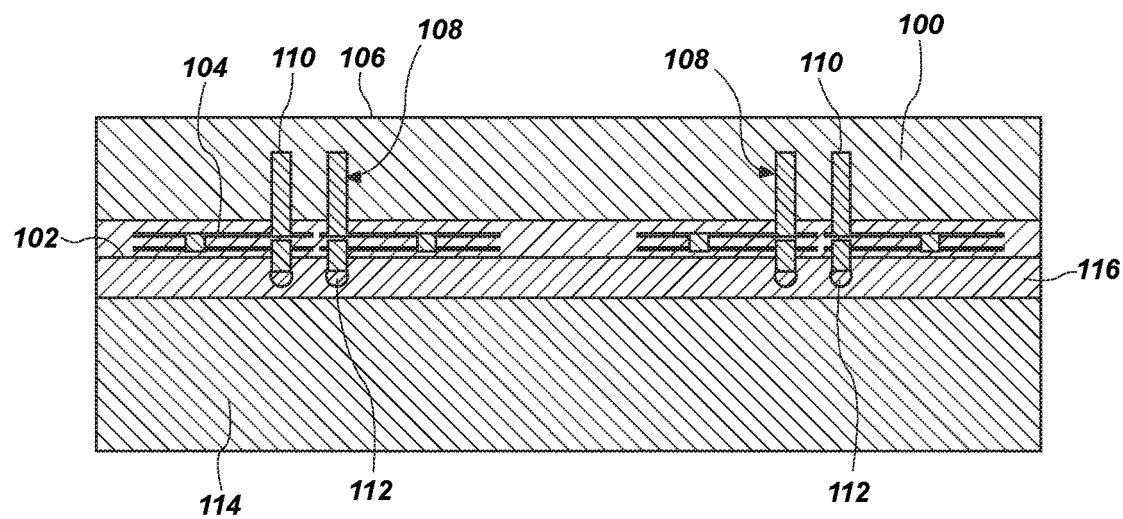
FIG. 3 is a schematic cross-sectional side view of the portion of the semiconductor wafer of FIG. 2 temporarily secured to a carrier substrate in a third stage of the method of making semiconductor device packages.

FIG. 3 is a cross-sectional side view of the portion of the first semiconductor wafer 100 of FIG. 2 inverted and temporarily secured to a carrier substrate 114 in a third stage of the method of making semiconductor device packages. The carrier substrate 114 may be configured to structurally support the first semiconductor wafer 100 during subsequent handling and processing. The carrier substrate 114 may include, for example, a semiconductor material (e.g., silicone), a ceramic material, or a glass material. The first semiconductor wafer 100 may be secured to the carrier substrate 114 by an adhesive material 116. More specifically, the adhesive material 116 may be interposed between the active surface 102 of the first semiconductor wafer 100 and the carrier substrate 114. The first set of electrically conductive elements 112 may be at least partially embedded within a thickness of the adhesive material 116, such that a thickness of the adhesive material 116 between the electrically conductive elements 112 and a facing surface of the carrier substrate 114 may be less than the thickness of the adhesive material extending directly between the active surface 102 and the carrier substrate 114. The inactive surface 106 of the first semiconductor wafer 100 may remain exposed when the first semiconductor wafer 100 is secured to the carrier substrate 114.

Figure 4:
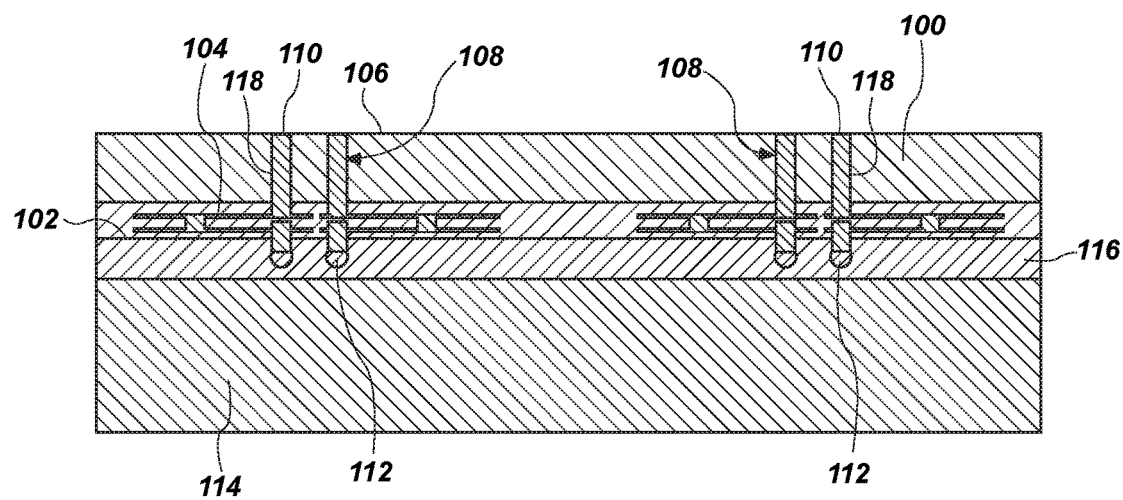
FIG. 4 is a schematic cross-sectional side view of the portion of the semiconductor wafer of FIG. 3 after a thinning process in a fourth stage of the method of making semiconductor device packages.

FIG. 4 is a cross-sectional side view of the portion of the first semiconductor wafer 100 of FIG. 3 after a thinning process in a fourth stage of the method of making semiconductor device packages. Semiconductor material of the first semiconductor wafer 100 may be removed from the inactive surface 106 to thin the first semiconductor wafer 100 to a final thickness. The semiconductor material of the first semiconductor wafer 100 may be removed from the inactive surface 106 at least until the electrically conductive material 110 within the formerly blind holes 108, now simply holes 108, is exposed. The removal process forms through vias 118 extending from the active surface 102 to the inactive surface 106, providing electrical connection therebetween utilizing the electrically conductive material 110. The first semiconductor wafer 100 may be thinned utilizing, for example, an abrasive grinding process, an etching process, or a combination thereof wherein the grinding, commonly termed "back grinding," removes a majority of the material of first semiconductor wafer 100 from the inactive surface 106, after which an etching process is employed to expose electrically conductive material 110 without stressing or smearing electrically conductive material 110.

Figure 5:
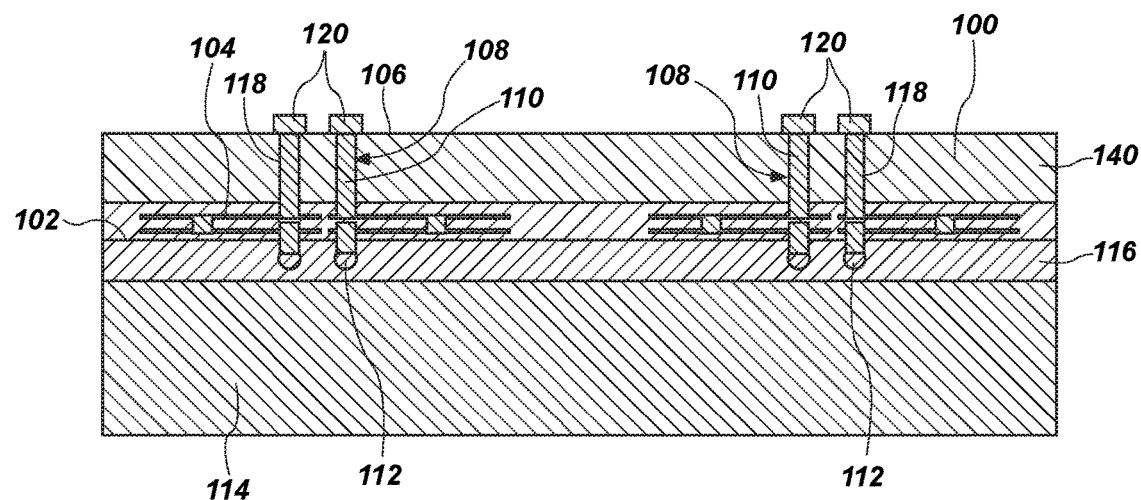
FIG. 5 is a schematic cross-sectional side view of the portion of the semiconductor wafer of FIG. 4 including additional conductive elements in a fifth stage of the method of making semiconductor device packages.

FIG. 5 is a cross-sectional side view of the portion of the first semiconductor wafer 100 of FIG. 4 including a second set of electrically conductive elements 120 in a fifth stage of the method of making semiconductor device packages. The second set of electrically conductive elements 120 may be located on the ends of the electrically conductive material 110 in the vias 118 proximate to the inactive surface 106, on a side of the through vias 118 opposite the first set of electrically conductive elements 112. The second set of electrically conductive elements 120 may include, for example, pads, pillars, studs, balls or bumps of electrically conductive material (e.g., metal or metal alloys). The second set of electrically conductive elements 120 may be positioned on the electrically conductive material 110 in the through vias 118 utilizing, for example, ball grid array formation, electroplating, or electroless plating techniques. In some embodiments, each region of integrated circuitry 104 may be tested for its operational characteristics by contacting a testing apparatus (e.g., one or more probes) to either or both of the first set of electrically conductive elements 112 and the second set of electrically conductive elements 120 and detecting the response of the integrated circuitry 104 to applied signals.

Figure 6:
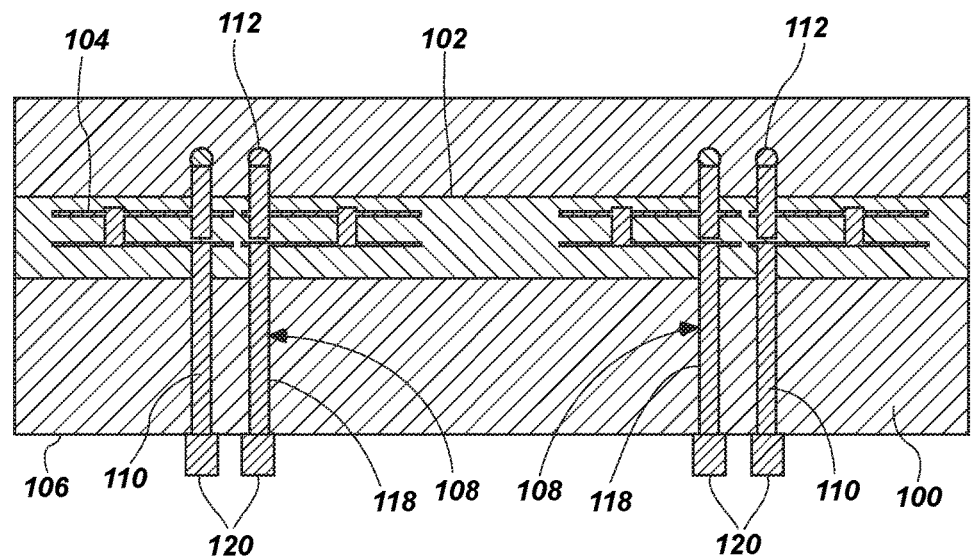
FIG. 6 is a schematic cross-sectional side view of the portion of the semiconductor wafer of FIG. 5 lacking the carrier substrate in a sixth stage of the method of making semiconductor device packages.

FIG. 6 is a cross-sectional side view of the portion of the first semiconductor wafer 100 of FIG. 5 after application of a dielectric underfill material 140 in the form of a non-conductive film and removal of the carrier substrate 114 (see FIG. 5) in a sixth stage of the method of making semiconductor device packages. The carrier substrate 114 (see FIG. 5) may be removed by, for example, weakening the bond provided by adhesive material 116 (see FIG. 5) and displacing the first semiconductor wafer 100 and the carrier substrate 114 (see FIG. 5) relative to one another. More specifically, the adhesive material 116 (see FIG. 5) bond may be weakened in response to exposure to heat (e.g., in a furnace or from a laser), and the carrier substrate 114 (see FIG. 5) may be slid laterally (i.e., in a direction parallel to the active surface 102 of the first semiconductor wafer 100) or lifted from one side to the other relative to the first semiconductor wafer 100 until the adhesive bond therebetween releases.

Figure 7:
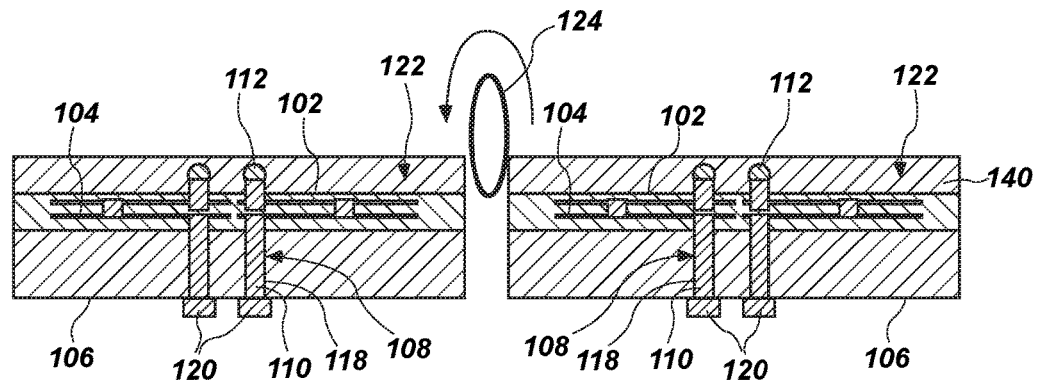
FIG. 7 is a schematic cross-sectional side view of singulated semiconductor dice in a seventh stage of the method of making semiconductor device packages.

FIG. 7 is a cross-sectional side view of singulated semiconductor dice 122 in a seventh stage of the method of making semiconductor device packages. The first semiconductor wafer 100 (see FIGS. 1-6), while being supported on a carrier structure, for example a film frame or a wafer chuck, may be singulated into the semiconductor dice 122 utilizing a dicing apparatus 124 (e.g., a saw) as known in the art, which dicing apparatus 124 may be used to cut entirely through the semiconductor material of the first semiconductor wafer 100 (see FIGS. 1-6) along streets between adjacent, independent regions of integrated circuitry 104. The resulting semiconductor dice 122 may include, for example, an active surface 102 bearing integrated circuitry 104. The first set of electrically conductive elements 112 may be exposed at the active surface 102, and the through vias 118 may extend from the first set of electrically conductive elements 112, through the semiconductor die 122, to the second set of electrically conductive elements 120 exposed at the inactive surface 106.

Figure 8:
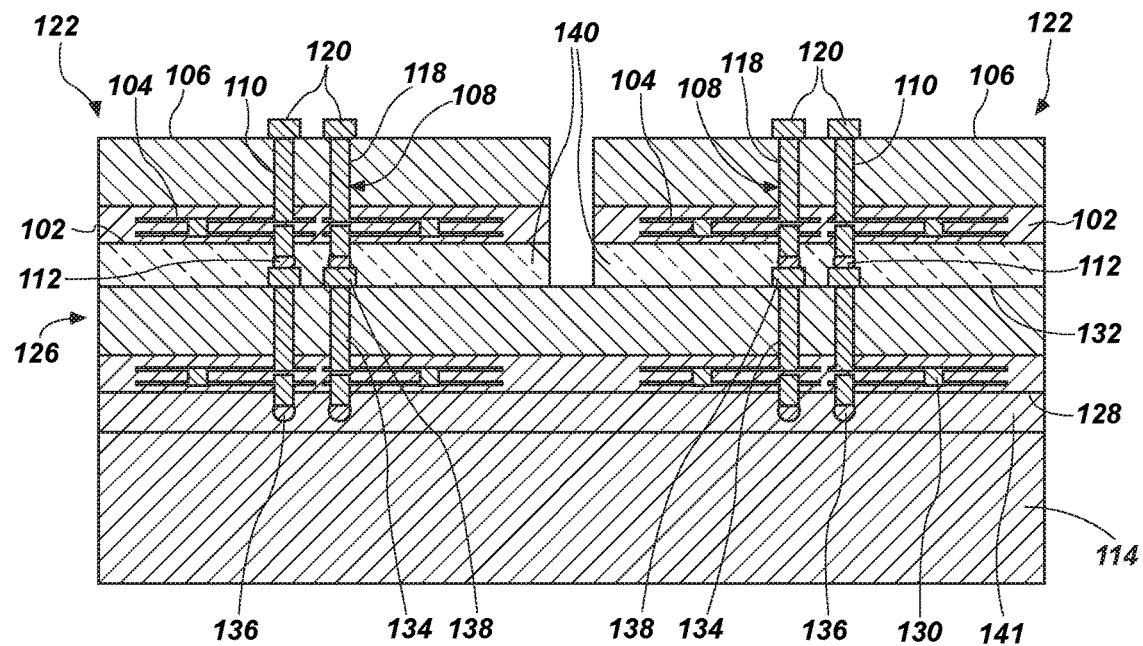
FIG. 8 is a schematic cross-sectional side view of the semiconductor dice of FIG. 7 stacked on another semiconductor wafer in an eighth stage of the method of making semiconductor device packages.

FIG. 8 is a cross-sectional side view of the semiconductor dice 122 of FIG. 7 stacked on a second semiconductor wafer 126 in an eighth stage of the method of making semiconductor device packages. The second semiconductor wafer 126 may include a semiconductor material such as, for example, silicon, and may have an active surface 128 bearing distinct, laterally spaced regions of integrated circuitry 130 and an inactive surface 132 located on a side of the second semiconductor wafer 126 opposite the active surface 128. The integrated circuitry 130 may be configured to perform desired operations, such as, for example, acting as a logic controller for associated computer memory. The second semiconductor wafer 126 may further include through vias 134 extending from the active surface 128 to the inactive surface 132, a third set of electrically conductive elements 136 located at an end of the through vias 134 proximate to the active surface 128 and a fourth set of electrically conductive elements 138 located at an opposite end of the vias 134 proximate to the inactive surface 132. The second semiconductor wafer may be temporarily secured to a carrier substrate 114 utilizing an adhesive material 141, which may be the same carrier substrate 114 and same type of adhesive material 141 as those used for the first semiconductor wafer 100 or different therefrom. The second semiconductor wafer 126 may be formed by performing actions at least substantially similar to those described previously in connection with FIGS. 1 through 5 in connection with the first semiconductor wafer. Notably, second semiconductor wafer 126 may be a homogeneous wafer of silicon, rather than a reconstituted wafer comprising a number of previously singulated wafer segments reformed into a reconstituted wafer prior to application of semiconductor dice thereto and subsequent encapsulation and attachment of a redistribution layer. Thus, fabrication time and expense may be reduced, and potential damage from wafer segment handling and processing into a reconstituted wafer avoided.

The semiconductor dice 122 may be inverted and positioned on corresponding, mutually aligned locations of regions of integrated circuitry 130 on the second semiconductor wafer 126. For example, the first set of electrically conductive elements 112 of a semiconductor die 122 may be brought into contact with the fourth set of electrically conductive elements 138 of a region of integrated circuitry 130, such that the active surfaces 102 of the semiconductor dice 122 may be located proximate to the inactive surface 132 of the second semiconductor wafer 126 and the active surface 128 of the second semiconductor wafer 126 may be located on a side of the second semiconductor wafer 126 opposite the semiconductor dice 122. Pressure may be applied to urge the semiconductor dice 122 toward the second semiconductor wafer 126, the atmosphere may be controlled (e.g., by introducing an inert gas, such as argon, or by forming an at least substantial vacuum), and heat may be applied (e.g., utilizing a furnace or laser). The applied heat may be, for example, less than the melting temperatures of the metal or metal alloy materials of the first set of electrically conductive elements 112 and the fourth set of electrically conductive elements 138. The metal or metal alloy materials of the first set of electrically conductive elements 112 and the fourth set of electrically conductive elements 138 may diffuse into one another, forming a thermo-compression bond. Underfill material 140, having been preplaced on semiconductor dice 122, is interposed between the active surfaces 102 of the semiconductor dice 122 and the inactive surface 132 of the second semiconductor wafer 126. The underfill material 140 may be, as noted above, a non-conductive film. Other underfill materials may be used in lieu of a non-conductive film, for example, a dielectric capillary underfill, a pre-applied non-conductive paste, or a molded underfill.

Figure 9:
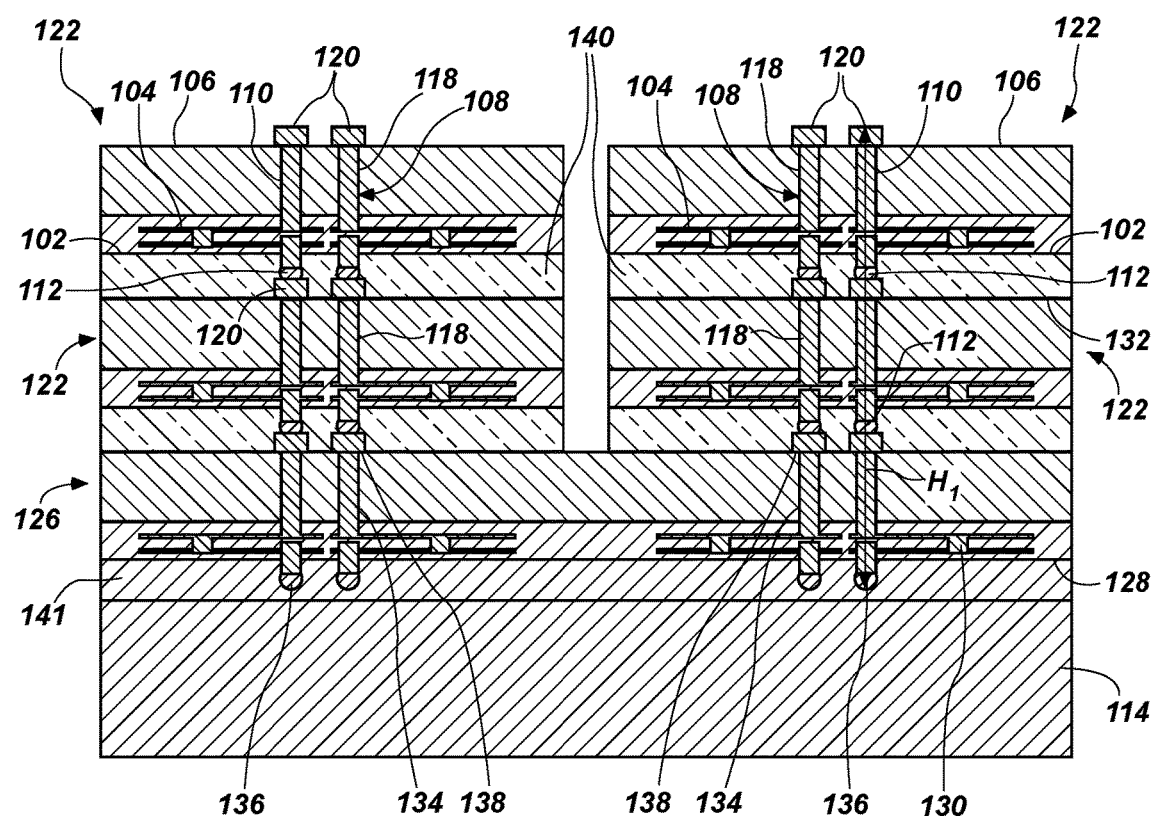
FIG. 9 is a schematic cross-sectional side view of additional semiconductor dice stacked on the other semiconductor wafer of FIG. 8 in a ninth stage of the method of making semiconductor device packages.

A height of the electrical interconnection formed utilizing the first set of electrically conductive elements 112 and the fourth set of electrically conductive elements 138 may be minimized because thermo-compression bonding may be used, particularly in comparison to other techniques, such as reflowing solder balls brought into contact with terminal pads of another component. In addition, thermo-compression bonding may enable use of a finer pitch for the first set of electrically conductive elements 112 and the fourth set of electrically conductive elements 138 because such a technique may reduce (e.g., eliminate) the risk that melted metal material may flow laterally and form unintended electrical connections and consequent shorting. For example, a pitch of each of the first set of electrically conductive elements 112 and the fourth set of electrically conductive elements 138, as measured by taking a smallest lateral distance between adjacent pairs of the first set of electrically conductive elements 112 or the fourth set of electrically conductive elements 138, may be about 100 μm or less. More specifically, the pitch of each of the first set of electrically conductive elements 112 and the fourth set of electrically conductive elements 138 may be about 90 μm or less FIG. 9 is a cross-sectional side view of additional semiconductor dice 122 stacked on the second semiconductor wafer 126 of FIG. 8 in a ninth stage of the method of making semiconductor device packages. While only one level of additional semiconductor dice 122 is illustrated, the disclosure is not so limited. For example, stacks of semiconductor dice 122 on a second semiconductor wafer 126 may comprise four, eight, twelve or sixteen semiconductor dice 122. The additional semiconductor dice 122 may be at least substantially similar to those already placed on, and operatively connected to, the second semiconductor wafer 126. In addition, the additional semiconductor dice 122 may be secured to the underlying semiconductor dice 122 utilizing thermo-compression bonding in some embodiments. For example, the first set of electrically conductive elements 112 of an overlying semiconductor die 122 may be brought into contact with the second set of electrically conductive elements 120 of an underlying semiconductor die 122, such that the active surface 102 of the overlying semiconductor die 122 may be located proximate to the inactive surface 106 of the underlying semiconductor die 122 and the active surface 102 of the underlying semiconductor die 122 may be located on a side of the underlying semiconductor die 122 opposite the overlying semiconductor die 122. Pressure may be applied to urge the semiconductor dice 122 toward one another, the atmosphere may be controlled, and heat may be applied, for example, less than the melting temperatures of the metal or metal alloy materials of the first set of electrically conductive elements 112 and the second set of electrically conductive elements 120. The metal or metal alloy materials of the first set of electrically conductive elements 112 and the second set of electrically conductive elements 120 may diffuse into one another, forming a thermo-compression bond. An underfill material 140 may be interposed between the active surface 102 of the overlying semiconductor die 122 and the inactive surface 106 of the underlying semiconductor die 122. In other embodiments, the additional semiconductor dice 122 may be secured to underlying semiconductor dice 122 utilizing a solder placement and reflow process; however, pitch and assembly height requirements may be comprised in such an instance.

A greatest height $H_1$ of a completed stack of semiconductor dice 122, as measured from the fourth set of electrically conductive elements 138 of the second semiconductor wafer 126 to the second set of electrically conductive elements 120 of the uppermost semiconductor die 122 in the stack in a direction at least substantially perpendicular to active surfaces 102, may be about 0.1 mm or less per semiconductor die 122 in the stack. More specifically, the greatest height $H_1$ of the completed stack of semiconductor dice 122 may be, for example, about 0.095 mm per semiconductor die 122 in the stack or less. As a specific, nonlimiting example, the greatest height $H_1$ of the completed stack of semiconductor dice 122 may be about 0.09 mm per semiconductor die 122 in the stack or less. As a specific example, in the case of an eight-high stack of semiconductor dice 122, the height of the stack may be less than about 0.8 mm.

Figure 10:
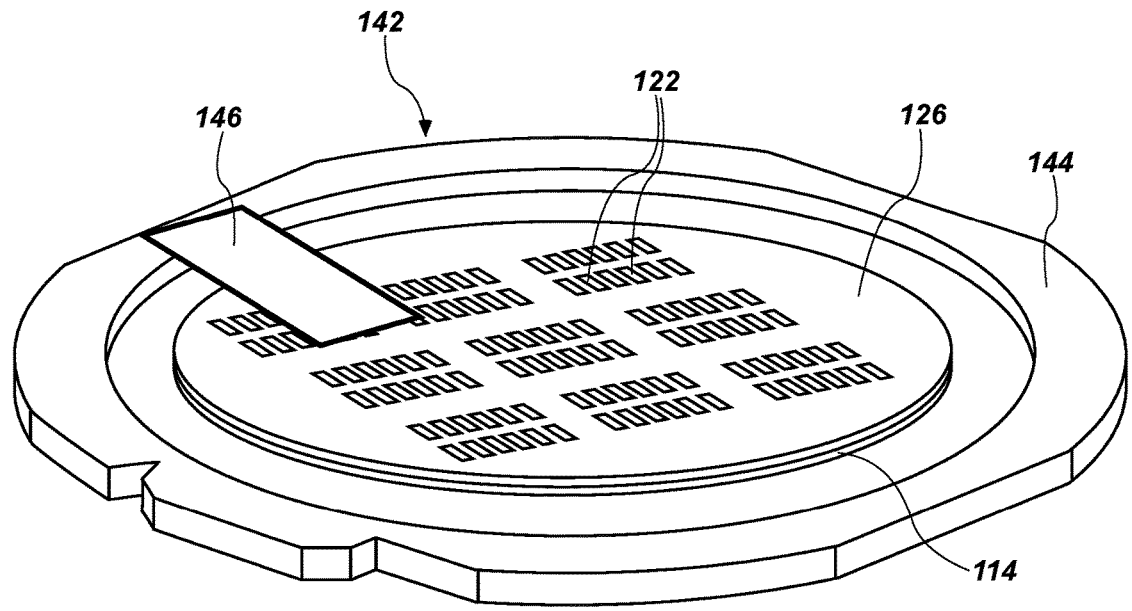
FIG. 10 is a schematic perspective view of a testing apparatus for testing the stacks of the semiconductor dice and other semiconductor wafer of FIG. 9 in a tenth stage of the method of making semiconductor device packages.

FIG. 10 is a schematic perspective view of a portion of a testing apparatus 142 for testing the stacks of the semiconductor dice 122 and the second semiconductor wafer 126 of FIG. 9 in a tenth stage of the method of making semiconductor device packages. The second semiconductor wafer 126 and stacks of semiconductor dice 122 may be supported on a wafer-handling apparatus 144, such as, for example, a chuck or a film frame. A probe tool 146 operably coupled to a test controller (not shown) including electrical contacts in the form of probe needles on an underside thereof may be brought proximate to the stacks of semiconductor dice 122, the electrical contacts may be brought into physical and electrical contact with the exposed second sets of electrically conductive elements 120, and signals may be sent from the probe into the second sets of electrically conductive elements 120 of each of the stacks of semiconductor dice 122. The response of each stack of semiconductor dice 122 and the corresponding location of the second semiconductor wafer 126 may be detected by the probe tool 146, and the responses may be stored by the test controller testing apparatus 142 for characterization and identification of operative stacks of semiconductor dice 122 and corresponding locations of the second semiconductor wafer 126.

Figure 11:
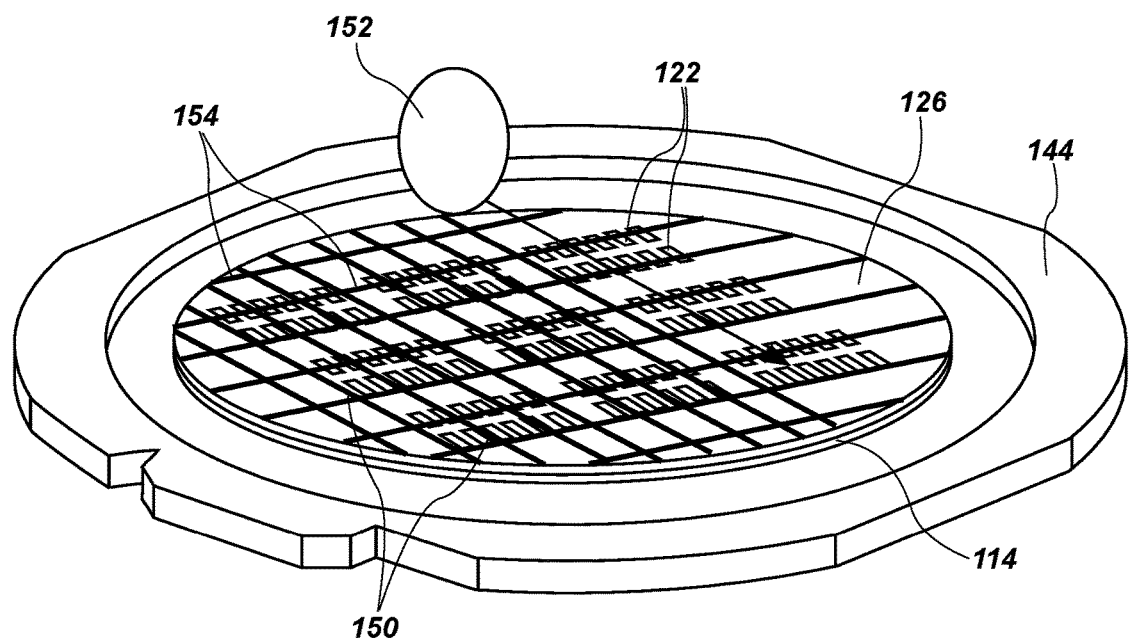
FIG. 11 is a schematic perspective view of the semiconductor dice and other semiconductor wafer of FIG. 10 during singulation of semiconductor device modules in an eleventh stage of the method of making semiconductor device packages.

FIG. 11 is a perspective view of the semiconductor dice 122 and second semiconductor wafer 126 of FIG. 10 during singulation of semiconductor device modules 150 in an eleventh stage of the method of making semiconductor device packages. After testing, a dicing apparatus 152 (e.g., a saw), which may be the same as, or different from, the dicing apparatus 124 (see FIG. 7), may be extended between stacks of semiconductor dice 122 and cut through the semiconductor material of the second semiconductor wafer 126 along streets 154 between adjacent, independent regions of integrated circuitry 104, creating singulated segments of the second semiconductor wafer 126, each bearing a stack of previously singulated semiconductor dice. The resulting semiconductor device modules 150 may include, for example, one of the locations of the second semiconductor wafer 126 and a stack of semiconductor dice 122 thereon.

Figure 12:
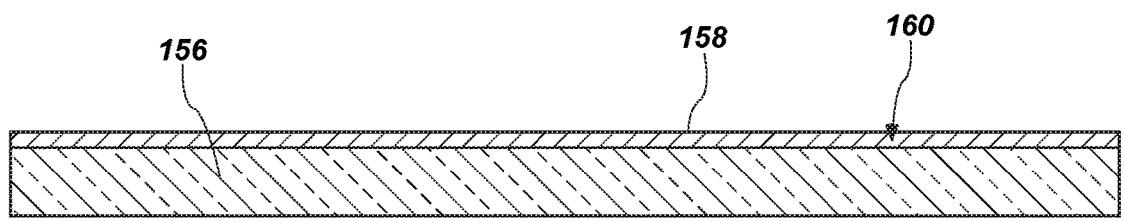
FIG. 12 is a cross-sectional side view of another carrier substrate in a twelfth stage of the method of making semiconductor device packages.

FIG. 12 is a cross-sectional side view of another carrier substrate 156 in a twelfth stage of the method of making semiconductor device packages. The carrier substrate 156 may include, for example, a semiconductor material (e.g. silicon), a ceramic material or a glass material. At least one major surface 158 of the carrier substrate 156 may include a separation material 160. The separation material 160 of the major surface 158 may include, for example, an adhesive material. As specific, nonlimiting examples, the separation material 160 may include, for example, light-to-heat-conversion release coating (LTHC), LC-3200 adhesive material, or ATT-4025 adhesive material, each commercially available from 3M of Maplewood, Minn.

Figure 13:
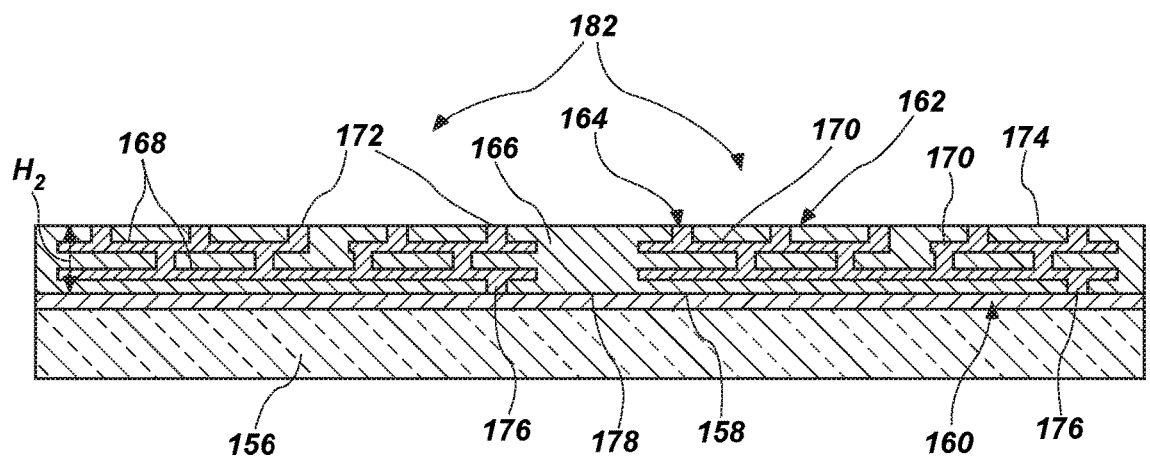
FIG. 13 is a cross-sectional side view of the carrier substrate of FIG. 12 including a support structure with electrical connections therein in a thirteenth stage of the method of making semiconductor device packages.

FIG. 13 is a cross-sectional side view of the carrier substrate 156 of FIG. 12 including a support structure 162 with electrical connections 164 therein in a thirteenth stage of the method of making semiconductor device packages. The support structure 162 may include, for example, a redistribution layer comprising one or more levels of conductive traces separated by dielectric material. More specifically, the support structure 162 in the form of a redistribution layer may be formed by sequentially placing one or more layers of a dielectric material 166 such as a photosensitive polyimide on the carrier substrate 156, patterning and removing portions of the dielectric material 166 by photolithography and etching to form one or more levels of trenches 168 in a pattern in the dielectric material 166, and placing electrically conductive material 170 in the trenches 168 to form traces for the electrical connections 164 in embodiments where the support structure 162 comprises a redistribution layer. Vertical connections between levels of electrically conductive material 170 comprising traces may be formed by patterning holes in levels of dielectric material 166 between trace levels and filling with electrically conductive material 170. In addition to electrical connections 164, passive components such as resistors, capacitors and inductors may be formed in the support structure 162, as known in the art.

The electrical connections 164 of the support structure 162 may include multiple, exposed bond locations 172 located on a side of the support structure 162 opposite the carrier substrate 156. The bond locations 172 may include portions of the electrically conductive material 170 exposed for electrical connection at a surface 174 of the support structure 162 opposite the carrier substrate 156. The electrical connections 164 may further include at least one connector location 176 located on a side of the support structure 162 proximate to the carrier substrate 156. The connector location 176 may include one or more portions of the electrically conductive material 170 exposed for electrical connection at another surface 178 of the support structure 162 temporarily secured to the carrier substrate 156 by the separation material 160.

The support structure 162 may be thinner than conventional supports for such semiconductor device modules, such as, for example, printed circuit boards. For example, a greatest height $H_2$ of the support structure 162, as measured in a direction at least substantially perpendicular to a major plane of the support structure 162, may be about 50 µm or less. More specifically, the greatest height $H_2$ of the support structure 162 may be about 45 µm or less.

The support structure 162 may include multiple, discrete laterally spaced package locations 182, each configured to receive a set of semiconductor device modules 150 each comprising at least two of the semiconductor device modules 150 (see FIG. 14) thereon. Each package location 182 may then be configured for separation from the other package locations 182 to form a semiconductor device package.

Figure 14:
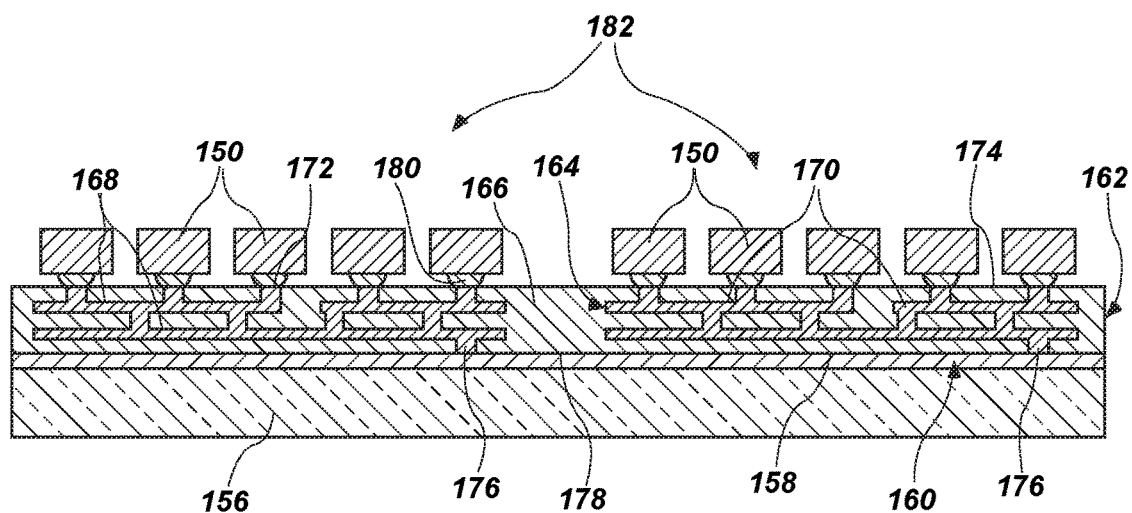
FIG. 14 is a cross-sectional side view of the support structure of FIG. 13 including semiconductor device modules of FIG. 11 thereon in a fourteenth stage of the method of making semiconductor device packages.

FIG. 14 is a cross-sectional side view of the support structure 162 of FIG. 13 including semiconductor device modules 150 of FIG. 11 thereon in a fourteenth stage of the method of making semiconductor device packages. The third set of electrically conductive elements 136 located on the active surface 128 (see FIG. 9) of the lowermost semiconductor die 122 (see FIG. 9) singulated from the second semiconductor wafer 126 (see FIG. 9) in each semiconductor device module 150 may be brought into contact with corresponding bond locations 172 of the support structure 162, either directly by a thermo-compression bond or via an intermediate, electrically conductive element 180 (e.g., a solder ball). The semiconductor device module 150 may be physically and operationally connected to the support structure 162 by, for example, thermo-compression bonding or performing a solder reflow to bond the third set of electrically conductive elements 136 to the corresponding bond locations 172.

Figure 15:
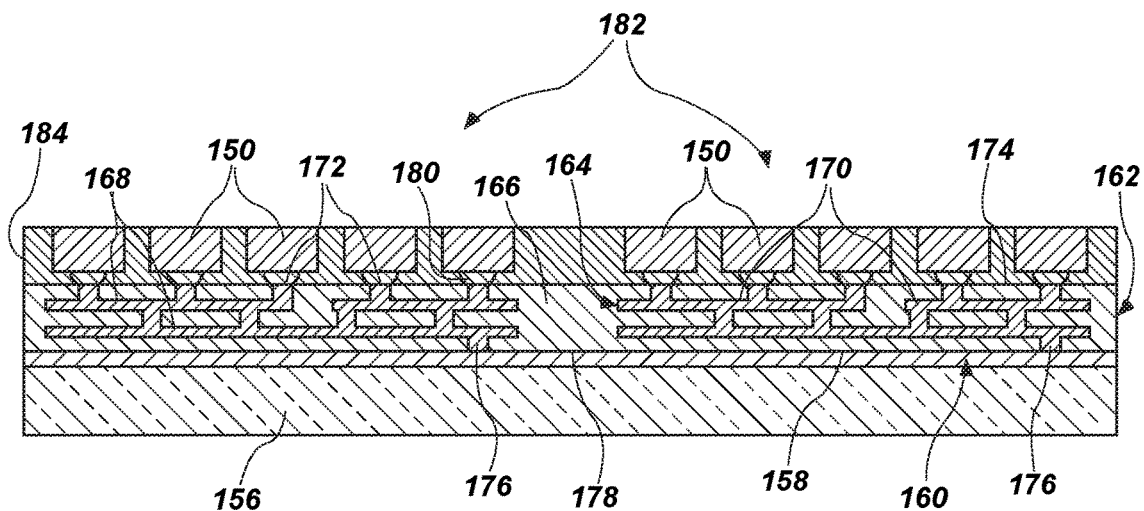
FIG. 15 is a cross-sectional side view of the support structure and semiconductor device modules of FIG. 11 including a molding material in a fourteenth stage of the method of making semiconductor device packages.

FIG. 15 is a cross-sectional side view of the support structure 162 and semiconductor device modules 150 of FIG. 11 including a dielectric molding material 184 in a fourteenth stage of the method of making semiconductor device packages. In a modified fan-out-package process, the molding material 184 may be positioned at least partially around the semiconductor device modules 150 over the surface 174 of the support structure 162. More specifically, a precursor of the molding material 184 may be flowed at least laterally around the semiconductor device modules 150 over the surface of the support structure 162 and subsequently cured to form the molding material 184. If molding material encapsulating the surfaces of semiconductor device modules 150 opposite support structure 162 is unwanted, it may be removed to a level coplanar with the module surfaces by back grinding. The molding material 184 may include, for example, a dielectric encapsulant material. As specific, nonlimiting examples, the molding material 184 may be liquid compound R4502-H1 or R4502-A1, available from Nagase ChemteX Corp. of Osaka, Japan; granular compound X89279, available from Sumitomo Corp. of Tokyo, Japan; powder compound GE-100-PWL2-imp1c from Hitachi Chemical Co., Ltd. of Tokyo, Japan; granular compound XKE G7176, available from Kyocera Chemical Corp. of Kawaguchi, Japan; or sheet compound SINR DF5770M9 or SMC-851 from Shin-Etsu Chemical Co. of Tokyo, Japan.

In some embodiments and as noted above, the semiconductor device modules 150 may be exposed at a surface of the molding material 184 located opposite the support structure 162. For example, surfaces of the semiconductor device modules 150 located opposite the support structure 162 and a surface of the molding material 184 located laterally adjacent to the semiconductor device modules 150 may be coplanar, such arrangement facilitating heat transfer from semiconductor device modules 150, or attachment of a second support structure as described below. In other embodiments, the semiconductor device modules 150 may be completely embedded within the molding material 184, such that the surfaces of the semiconductor device modules 150 located opposite the support structure 162 may be concealed within the molding material 184.

Figure 16:
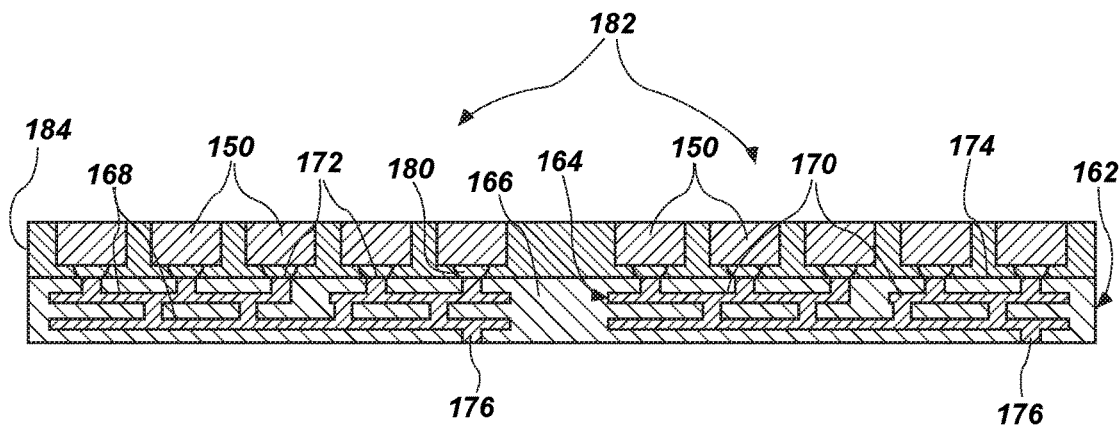
FIG. 16 is a cross-sectional side view of the support structure, the semiconductor device modules, and the molding material of FIG. 15 lacking the carrier substrate in a sixteenth stage of the method of making semiconductor device packages.

FIG. 16 is a cross-sectional side view of the support structure 162, the semiconductor device modules 150, and the molding material 184 of FIG. 15 lacking the carrier substrate 156 in a sixteenth stage of the method of making semiconductor device packages. The carrier substrate 156 (see FIG. 15) may be removed by, for example, weakening the separation material 160 (see FIG. 15) and displacing the support structure 162 and the carrier substrate 156 (see FIG. 15) relative to one another. More specifically, the separation material 160 (see FIG. 15) may be weakened in response to exposure to heat (e.g., in a furnace or from a laser), the carrier substrate 156 (see FIG. 15) may be slid laterally relative to the support structure 162 or lifted therefrom until the temporary bond therebetween releases.

At this stage of fabrication, a second support structure (not shown) may be fabricated and connected to, for example, electrically conductive elements 120 of uppermost semiconductor dice 122 of discrete package locations 182 on a side of the assembly opposite to support structure 162, in order to provide additional signal and power pins. The second support structure may be preformed as described above with respect to the fabrication of support structure 162 in conjunction with FIG. 13 and connected as previously described herein.

In other words, a semiconductor device structure produced by performing methods in accordance with this disclosure may include a redistribution layer having laterally spaced package locations, each package location including conductive traces and electrical connections on opposing sides of the redistribution layer. Sets of semiconductor device modules may be electrically connected to corresponding package locations on a surface of the redistribution layer. A molding material may at least partially surround each semiconductor module on the redistribution layer. At least some of the semiconductor device modules of each set may include a stack of semiconductor dice mutually electrically connected by thermo-compression bonds between adjacent electrically conductive elements on facing surfaces thereof.

Figure 17:
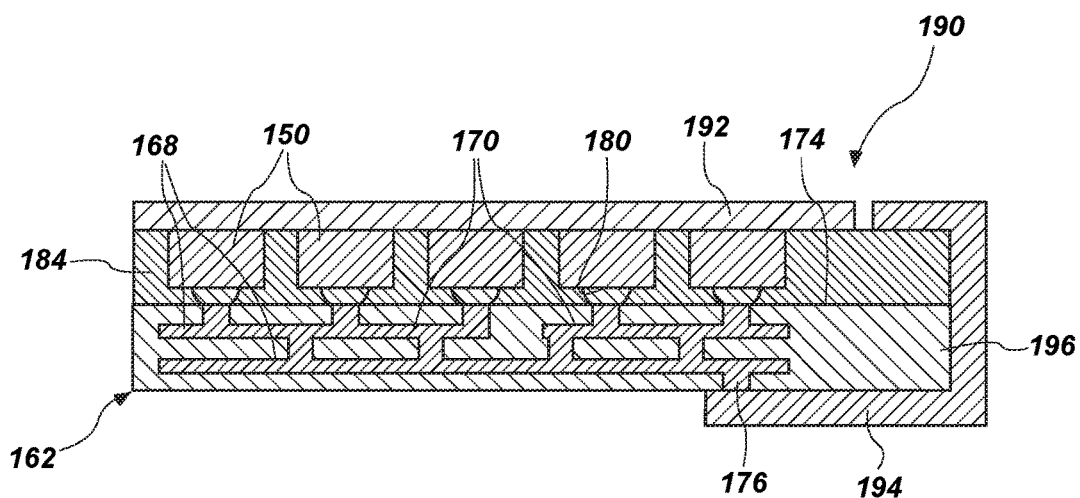
FIG. 17 is a cross-sectional side view of a semiconductor device package formed from the support structure, the semiconductor device modules, and the molding material of FIG. 16.

FIG. 17 is a cross-sectional side view of a semiconductor device package 190 formed from the support structure 162, the semiconductor device modules 150, and the molding material 184 of FIG. 16 after the assembly of FIG. 16 is singulated into separate semiconductor device packages 190. In some embodiments, the semiconductor device package 190 may include a thermal management device 192 operatively connected to the semiconductor device modules 150 on a side of the semiconductor device modules 150 opposite the support structure 162. The thermal management device 192 may be placed on the semiconductor device modules 150 before or after singulation of semiconductor device packages 190 and, if before, singulated with the packages. The thermal management device 192 may be configured as, for example, a heat spreader or heat sink, or an active cooling system. More specifically, the thermal management device 192 may include a mass of high-thermal-conductivity material (e.g., copper, aluminum, alloys thereof) located proximate to the surfaces of the semiconductor device modules 150 located opposite the support structure 162. In some embodiments, a thermal interface material may be interposed between the semiconductor device modules 150 and the thermal management device 192. The reduced thicknesses of the semiconductor device modules 150 and the support structure 162 may, unlike conventional assemblies providing similar functionality, enable the thermal management device 192 to be integrally included with the other components of the semiconductor device package 190, rather than added as a separate component only if vertical space permits.

The semiconductor device package 190 may further include a set of conductive elements 194, for example in the form of land pads, operatively connected to the connector locations 176 within the support structure 162. The conductive elements 194 may be configured to operatively connect the semiconductor device package 190 to a receiving socket, and may extend over three surfaces of the support structure 162. More specifically, the conductive elements 194 may, for example, conform to standardized specifications for a dual in-line memory module (DIMM), and may extend from the connector locations 176 on the side of the support structure 162 opposite the semiconductor device modules 150, laterally outward to a side surface 196 of the support structure 162, over the side surface 196 and over a coplanar portion of the molding material 184, and over a surface of the molding material 184 located on a side of the molding material 184 opposite the support structure 162.

In accordance with embodiments of the disclosure, use of a modified fan-out packaging technique enables package height reduction in combination with enhanced speed gain and power dissipation. Furthermore, the fabrication process eliminates process acts, eliminates some equipment, and reduces the potential for damage to components employed in the final assembly.

In other words, semiconductor device packages in accordance with this disclosure may include a support structure having electrical connections therein. Semiconductor device modules may be located on a surface of the support structure. A molding material may at least partially surround each semiconductor module on the surface of the support structure and may be connected to the electrical connections thereof. At least some of the semiconductor device modules may include a stack of semiconductor dice on a singulated semiconductor wafer segment, the semiconductor dice and the singulated semiconductor wafer segment being electrically connected by thermo-compression bonds and through vias. A molding material may at least partially surround and contact sides of each semiconductor die and singulated wafer segment of each semiconductor module on the surface of the support structure.

Methods of making semiconductor device packages may involve stacking semiconductor dice on laterally spaced regions of integrated circuitry on an active surface of a semiconductor wafer. A first semiconductor die in each stack located proximate the semiconductor wafer may be connected through thermo-compression bonds to a region of integrated circuitry of the semiconductor wafer. Each stack of the semiconductor dice may include electrically conductive elements exposed on a side thereof opposite the first semiconductor wafer. Each stack of the semiconductor dice may be tested via the electrically conductive elements. Semiconductor device modules comprising stacks of the semiconductor dice and a region of integrated circuitry of the semiconductor wafer may be singulated. Sets of the semiconductor device modules confirmed to be operative during testing through electrically conductive elements of the regions of integrated circuitry opposite stacks of semiconductor dice may be electrically connected to electrical connections of corresponding package locations on a surface of a support structure. Each semiconductor module may be at least partially surrounded on the surface of the support structure in a molding material. Semiconductor device packages, each comprising a set of the semiconductor device modules and a corresponding location of the support structure, may be singulated.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed herein, including legal equivalents. In addition, features from one disclosed embodiment may be combined with features of another disclosed embodiment while still being within the scope of this disclosure, as contemplated by the inventor.

What is claimed is:

1. A method of making semiconductor device packages, comprising:
    stacking semiconductor dice on laterally spaced regions of integrated circuitry on an active surface of a semiconductor wafer, a first semiconductor die in each stack located proximate the semiconductor wafer being connected through thermo-compression bonds to a region of integrated circuitry of the semiconductor wafer, each stack of the semiconductor dice including electrically conductive elements exposed on a side thereof opposite the semiconductor wafer;
    testing each stack of the semiconductor dice via the electrically conductive elements;
    singulating semiconductor device modules comprising stacks of the semiconductor dice and a region of integrated circuitry of the semiconductor wafer;
    electrically connecting sets of the semiconductor device modules confirmed to be operative during testing through electrically conductive elements of the regions of integrated circuitry opposite stacks of semiconductor dice to electrical connections of corresponding laterally adjacent package locations on a surface of a support structure;
    at least partially surrounding side surfaces of the semiconductor dice of each semiconductor module on the surface of the support structure in a molding material after singulating the semiconductor device modules and electrically connecting the sets of the semiconductor device modules to the electrical connections of the corresponding laterally adjacent package locations on the surface of the support structure;

electrically connecting the sets of the semiconductor device modules confirmed to be operative during testing to electrical connections of corresponding package locations on a surface of another support structure on exposed surfaces of the side of the semiconductor device modules opposite the support structure; and singulating semiconductor device packages each comprising a set of the semiconductor device modules and a corresponding location of the support structure.

2. The method of claim 1, further comprising placing a thermal management device on at least one set of semiconductor device modules on a side thereof opposite the support structure.

3. The method of claim 2, wherein placing the thermal management device on the at least one set of semiconductor device modules is effected before singulation of the semiconductor device packages.

4. The method of claim 1, further comprising forming conductive elements operatively connected to the electrical connections of the support structure on a side thereof opposite the set of semiconductor devices modules after singulating the semiconductor device packages.

5. The method of claim 1,
wherein electrically connecting the sets of semiconductor device modules to electrical connections of the corresponding package locations on the surface of the support structure comprises electrically connecting the sets of semiconductor device modules to the corresponding package locations on the surface of a redistribution layer; and
further comprising forming the redistribution layer prior to the electrically connecting the sets of semiconductor device modules.

6. The method of claim 5, further comprising:
forming the redistribution layer on a carrier; and
electrically connecting the sets of semiconductor device modules to the redistribution layer supported on the carrier.

7. The method of claim 1, further comprising forming the semiconductor dice prior to the stacking thereof by:
fabricating through vias in another semiconductor wafer comprising an active surface bearing integrated circuitry and an inactive surface located on a side of the another semiconductor wafer opposite the active surface;
placing a first set of electrically conductive elements connected to the through vias on the active surface;
placing a second set of electrically conductive elements connected to the through vias on the inactive surface; and
singulating the semiconductor dice from one another.

8. The method of claim 7, wherein fabricating the through vias in the another semiconductor wafer comprises forming blind holes extending from the active surface toward the inactive surface and at least partially filling the blind holes with an electrically conductive material.

9. The method of claim 8,
further comprising thinning the another semiconductor wafer to remove semiconductor material thereof from the inactive surface to expose the electrically conductive material located within the blind holes.

10. The method of claim 7, further comprising placing a non-conductive film over a surface of the another semiconductor wafer on a side thereof to face the semiconductor wafer for the stacking prior to singulation of the another semiconductor wafer.

11. The method of claim 1, further comprising forming the semiconductor wafer prior to the stacking of semiconductor dice thereon by:
fabricating through vias in regions bearing integrated circuitry of another semiconductor wafer comprising an active surface and an inactive surface located on a side of the another semiconductor wafer opposite the active surface;
placing a first set of electrically conductive elements connected to the through vias on the active surface; and
placing a second set of electrically conductive elements connected to the through vias on the inactive surface.

* * * * *